(12) United States Patent
Basoor et al.

(10) Patent No.: US 8,217,482 B2
(45) Date of Patent: Jul. 10, 2012

(54) INFRARED PROXIMITY SENSOR PACKAGE WITH REDUCED CROSSTALK

(75) Inventors: Suresh Basoor, Singapore (SG); Peng Yam Ng, Singapore (SG); Deng Peng Chen, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1019 days.

(21) Appl. No.: 11/962,535

(22) Filed: Dec. 21, 2007

(65) Prior Publication Data

US 2009/0159900 A1      Jun. 25, 2009

(51) Int. Cl.
*H01L 31/0232* (2006.01)
*H01L 21/00* (2006.01)

(52) U.S. Cl. ............ 257/436; 257/98; 257/99; 257/100; 257/432; 257/433; 257/E33.059; 257/E25.032; 438/30; 438/25; 438/27

(58) Field of Classification Search ................. 257/436, 257/98, 99, 100, 432, 433, E25.032, E33.059; 438/30, 25, 27, 48, 65
See application file for complete search history.

(56) References Cited

U.S. PATENT DOCUMENTS

| | | | |
|---|---|---|---|
| 5,155,777 A | 10/1992 | Angelopoulos et al. | |
| 5,367,393 A | 11/1994 | Ohara et al. | |
| 5,675,143 A | 10/1997 | Heimlicher | |
| 6,064,062 A | 5/2000 | Bohn | |
| 6,135,816 A | 10/2000 | Mashiyama et al. | |
| 6,180,881 B1 | 1/2001 | Isaak | |
| 6,364,706 B1 | 4/2002 | Ando et al. | |
| 6,572,410 B1 | 6/2003 | Volstorf et al. | |
| 6,635,955 B2 * | 10/2003 | Scheidle | 257/678 |
| 6,674,653 B1 | 1/2004 | Valentine | |
| 6,885,300 B1 | 4/2005 | Johnston et al. | |
| 7,026,710 B2 | 4/2006 | Coyle et al. | |
| 7,172,126 B2 | 2/2007 | Schmidt et al. | |
| 7,229,295 B2 | 6/2007 | Ice et al. | |
| 7,256,483 B2 | 8/2007 | Eppler et al. | |
| 7,258,264 B2 | 8/2007 | Ice et al. | |
| 7,277,012 B2 | 10/2007 | Johnston et al. | |
| 7,289,142 B2 | 10/2007 | Silverbrook | |
| 7,387,033 B2 | 6/2008 | Qing et al. | |
| 7,387,907 B2 | 6/2008 | Hsu et al. | |

(Continued)

FOREIGN PATENT DOCUMENTS

EP        1455564        9/2004

(Continued)

OTHER PUBLICATIONS

Agilent HSDL-9100 Miniature Surface-Mount Proximity Sensor Data Sheet; author and date unknown.

(Continued)

*Primary Examiner* — Nitin Parekh

(57) ABSTRACT

Disclosed are various embodiments of an infrared proximity sensor package comprising an infrared transmitter die, an infrared receiver die, a housing comprising outer sidewalls, a first recess, a second recess and a partitioning divider disposed between the first and second recesses. The transmitter die is positioned in the first recess, the receiver die is positioned within the second recess, and at least the partitioning divider of the housing comprises liquid crystal polymer (LCP) such that infrared light internally-reflected within the housing in the direction of the partitioning divider is substantially attenuated or absorbed by the LCP contained therein.

31 Claims, 6 Drawing Sheets

U.S. PATENT DOCUMENTS

| | | | |
|---|---|---|---|
| 7,427,806 B2* | 9/2008 | Arndt et al. | 257/682 |
| 7,510,888 B2 | 3/2009 | Guenther et al. | |
| 7,514,666 B2 | 6/2009 | Basoor et al. | |
| 7,675,132 B2* | 3/2010 | Waitl et al. | 257/434 |
| 7,767,485 B2 | 8/2010 | Ogawa et al. | |
| 2002/0172472 A1 | 11/2002 | Nelson et al. | |
| 2004/0065894 A1* | 4/2004 | Hashimoto et al. | 257/100 |
| 2005/0110157 A1* | 5/2005 | Sherrer et al. | 257/776 |
| 2006/0016994 A1 | 1/2006 | Basoor et al. | |
| 2006/0017069 A1 | 1/2006 | Bergmann | |
| 2006/0022212 A1* | 2/2006 | Waitl et al. | 257/98 |
| 2006/0022215 A1* | 2/2006 | Arndt et al. | 257/99 |
| 2006/0118807 A1* | 6/2006 | Ives et al. | 257/99 |
| 2007/0045524 A1 | 3/2007 | Rains | |
| 2007/0072321 A1* | 3/2007 | Sherrer et al. | 438/26 |
| 2008/0006762 A1 | 1/2008 | Fadell et al. | |
| 2008/0011939 A1 | 1/2008 | Yee | |
| 2008/0011940 A1 | 1/2008 | Zhang et al. | |
| 2008/0012033 A1* | 1/2008 | Arndt | 257/98 |
| 2008/0049210 A1 | 2/2008 | Takaoka | |
| 2008/0116379 A1 | 5/2008 | Teder | |
| 2008/0118241 A1 | 5/2008 | TeKolste et al. | |
| 2008/0173963 A1 | 7/2008 | Hsu et al. | |
| 2008/0197376 A1 | 8/2008 | Bert et al. | |
| 2008/0265266 A1* | 10/2008 | Bogner et al. | 257/98 |
| 2008/0296478 A1 | 12/2008 | Hemoult | |
| 2008/0308738 A1 | 12/2008 | Li et al. | |
| 2008/0308917 A1 | 12/2008 | Pressel et al. | |
| 2009/0027652 A1 | 1/2009 | Chang et al. | |
| 2009/0101804 A1 | 4/2009 | Le | |
| 2009/0129783 A1 | 5/2009 | Ori et al. | |
| 2009/0159900 A1 | 6/2009 | Basoor | |
| 2010/0030039 A1 | 2/2010 | Lamego et al. | |
| 2010/0246771 A1 | 9/2010 | Hawver et al. | |
| 2010/0282951 A1 | 11/2010 | Costello et al. | |
| 2011/0057104 A1 | 3/2011 | Yao et al. | |

FOREIGN PATENT DOCUMENTS

WO    WO-2009/072786    6/2009

OTHER PUBLICATIONS

XYDAR G-930—Solvay Advanced Ploymers—Liquid Crystal Polymer Data sheet; author unknown; Dec. 17, 2007; reproduced from website at www.ides.com/grades/ds/E22218.htm.

AlGaAs/GaAs Infrared Chip—TK 114IRA Data Sheet from TYNTEK website: Dec. 19, 2007.

Si Photo-Diode Chip—TK 043PD Data Sheet from TYNTEK website; Dec. 19, 2007.

Avago Technologies, "APDS-9005 Miniature Surface-Mount Ambient Light Photo Sensor", Jan. 2007.

Avago Technologies, "APDS-9101—Integrated Reflective Sensor", Data Sheet 2007.

Avago Technologies, "APDS-9700 Signal Conditioning IC for Optical Proximity Sensors", Jan. 4, 2008.

Avago Technologies, "HSDL-9100—Surface-Mount Proximity Sensor", Data Sheet 2006.

Avago Technologies, "Integrated Ambient Light and Proximity Sensor Prelim Datasheet", APDS-9800 Mar. 2, 2009.

Avago Technologies, "Integrated Optical Proximity Sensors Prelim Datasheet", APDS-9120 Feb. 25, 2009.

AZ Optics, "Device Debuts as the World's Best-Performing Integrated Light/Proximity Sensor", Nov. 11, 2008.

Costello, et al., "U.S. Appl. No. 12/495,739", Optical Proximity Sensor Package with Molded Infrared Light Rejection Barrier and Infrared Pass Components Jun. 30, 2009.

Ishihara, et al., "A Dual Face Package Using a Post with Wire Components: Novel Structure for PoP Wafer Level CSP and Compact Image Sensor Package", Electronic Components and Technology Conference 2008, 1093-1098.

Khamal, Ibrahim, "Infra-Red Proximity Sensor (II)", Apr. 4, 2008.

Nitto Denko Corporation, "Technical Data Sheet", NT-8506 2001.

Nitto Denko Corporation, "Technical Data Sheet", NT-MB-IRL3801 2008.

Penchem Technologies Data Sheet, "PEMCHEM OP 580", IR Filter Optoelectronic Epoxy Apr. 2009.

Penchem Technologies Data Sheet, "PENCHEM OP 579", IR Pass Optoelectronic Epoxy Apr. 2009.

Tan, et al., "U.S. Appl. No. 12/623,767", Infrared Proximity Sensor Package with Improved Crosstalk Isolation, filed Nov. 23, 2009, 30 pages.

TYNTEK, "Data Sheet for AlGaAs/GaAs Infrared Chip", TK116IRA Nov. 2006.

TYNTEK, "Data Sheet for Si Photo-diode Chip", TK 043PD Jun. 2004.

Lossee, et al., "A ⅓ Format Image Sensor with Refractory Metal Light Shield for Color Video Applications", Solid State Circuits Conference, *Digest of Technical Papers*, 36th ISSCC, IEEE International Volume. Feb. 1989, pp. 90-91.

* cited by examiner

INFRARED PROXIMITY SENSOR PACKAGE WITH REDUCED CROSSTALK

FIELD OF THE INVENTION

Various embodiments relate to the field of infrared proximity sensor packages generally, devices which employ such packages, and methods of making and using same.

BACKGROUND

Infrared proximity sensor packages are known in the art. One example of such a device is the AVAGO TECHNOLOGIES™ HSDL-9100 analog-output reflective sensor package, which contains an integrated high efficiency infrared emitter and a detector or photodiode housed in a small form factor surface mount device (SMD) package. In the HSDL-9100 proximity sensor package, as in many other proximity sensor packages manufactured by companies other than AVAGO TECHNOLOGIES™ such as SHARP™, ROHM™ and VISHAY™, infrared transmitter dice must be placed in very close proximity to infrared receiver dice (i.e., mere millimeters apart in the same package). Transmitted or received Infrared light rays tend to bounce around or reflect internally within such packages, resulting in undesired infrared signal crosstalk occurring in respect of both the transmitter dice and the receiver dice. As the demand for ever smaller proximity sensor packages increases, the problem of eliminating or reducing such infrared signal crosstalk becomes more severe.

The HSDL-9100 package comprises a stainless steel housing that requires over 30 separate steps to manufacture, including relatively intricate metal folding steps. Other types of housings that have been employed in prior art infrared proximity sensors include metal foil and metal-plated or coated plastics. Metal foil housings feature numerous seams and thus have a tendency to leak undesired internally-reflected infrared signals through or around such seams. Metal-plated plastic housings are difficult and expensive to manufacture, and in general do not feature very high levels of infrared signal crosstalk isolation between the transmitter and receiver portions thereof. Further exacerbating the foregoing problems is the distinct tendency of infrared radiation to pass substantially or barely unattenuated through many different materials, such as printed circuit boards, many plastics and polymers, and even thin ceramic materials.

What is needed is a housing for an infrared proximity sensor package that features reduced infrared signal crosstalk and that is inexpensive and easy to manufacture.

SUMMARY

In one embodiment, there is provided an infrared proximity sensor package comprising an infrared transmitter die, an infrared receiver die, a housing comprising outer sidewalls, a first recess, a second recess and a partitioning divider disposed between the first and second recesses. The transmitter die is disposed in the first recess, the receiver die is disposed in the second recess, and at least the partitioning divider comprises liquid crystal polymer (LCP) such that infrared light internally-reflected within the housing in the direction of the partitioning divider is substantially attenuated or absorbed by the LCP contained therein.

In another embodiment, there is provided a method of making an infrared proximity sensor package comprising providing an infrared transmitter die, providing an infrared receiver die, providing a housing comprising outer sidewalls, a first recess, a second recess, and a partitioning divider disposed between the first recess and the second recess, at least the partitioning divider comprising liquid crystal polymer (LCP) such that infrared light internally-reflected within the housing in the direction of the partitioning divider is substantially attenuated or absorbed by the LCP contained therein, positioning the transmitter die within the first recess, and positioning the receiver die within the second recess.

In other embodiments, there are provided methods of using and making the foregoing infrared proximity sensor package. Numerous other embodiments are also contemplated.

BRIEF DESCRIPTION OF THE DRAWINGS

The drawings are not necessarily to scale. Like numbers refer to like parts or steps throughout the drawings.

DETAILED DESCRIPTIONS OF SOME PREFERRED EMBODIMENTS

In the following Detailed Description, reference is made to the accompanying drawings, which form a part hereof, and in which are illustrated specific embodiments according to which the invention may be practiced. In this regard, directional terminology, such as "top," "bottom," "atop," "beneath," "forward," "backward," "side," "front," "back," etc., is used with reference to the orientation of the Figures being described. Because the components of various embodiments of the invention may be positioned in a number of different orientations, the directional terminology is used for purposes of illustration and is in no way limiting. It is to be understood that other embodiments may be utilized, and that structural or logical changes may be made without departing from the scope of the present invention. The following Detailed Description, therefore, is not to be taken in a limiting sense, and the scope of the present invention is defined by the appended claims.

Figure 1:
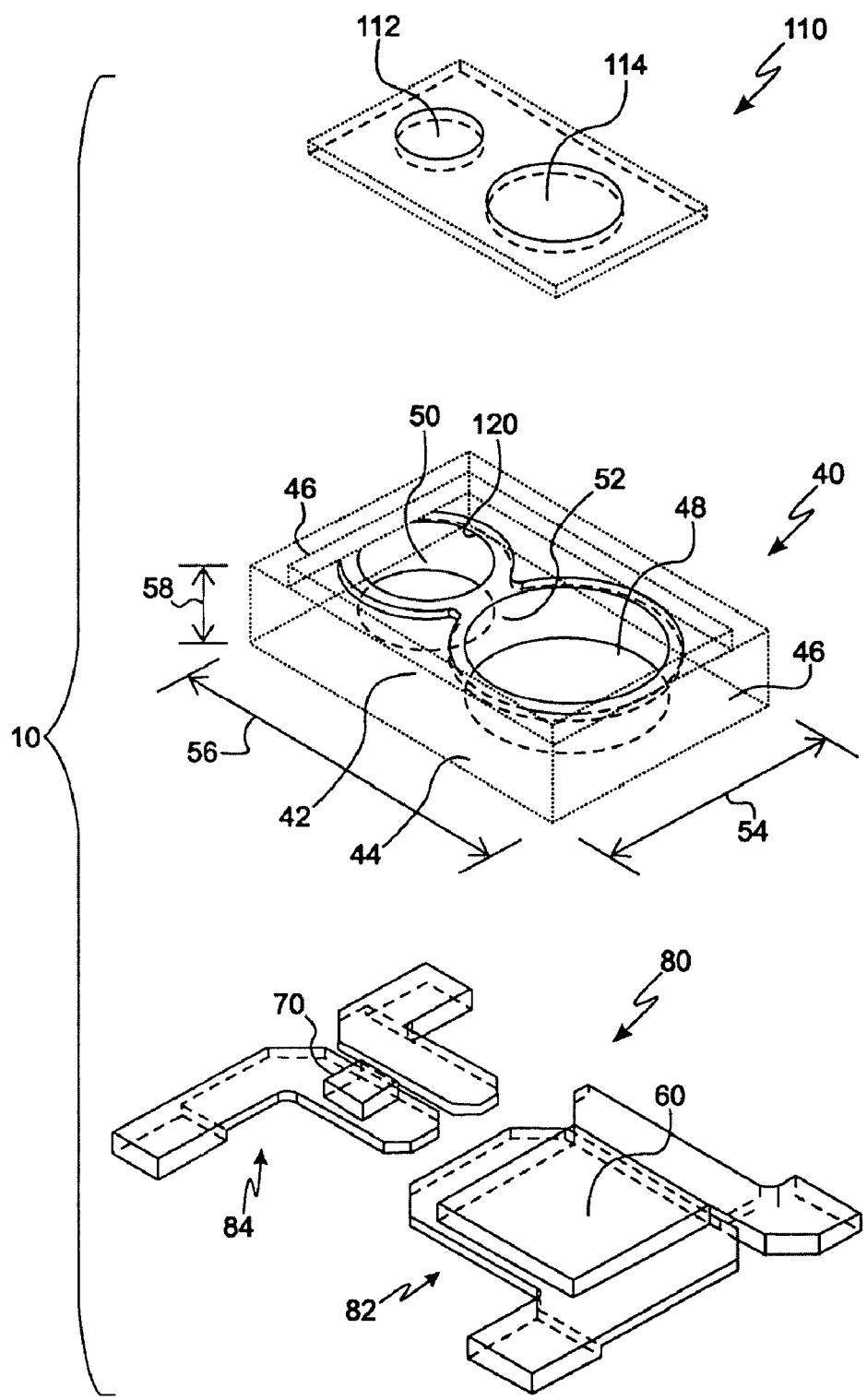
FIG. 1 is an exploded top perspective view of one embodiment of an infrared proximity sensor package.

FIG. 1 is an exploded top perspective view of one embodiment of infrared proximity sensor package 10. Lens 110 fits atop housing 40, which in turn sits atop and is attached to lead frame 80. As shown in the embodiment illustrated in FIG. 1, infrared proximity sensor package 10 comprises quad flat no lead (QFN) lead frame 80 having infrared transmitter die 70 secured to first frame portion 84 thereof, infrared receiver die 60 secured to second frame portion 82 thereof. Lead frame 80 is preferably configured to fit beneath housing 40 and engage lower portion 44 thereof. Housing 40 comprises upper housing portion 42, lower housing portion 44, outer sidewalls 46, and first recess 50 and second recess 48 extending vertically between upper and lower housing portions 42 and 44. First and second recesses 50 and 48 are separated by partitioning divider 52, which in a preferred embodiment is integrally molded to the remainder of housing 40.

As further shown in FIG. 1, transmitter die 70 is disposed on first frame portion 84 and is positioned within first recess 50. Receiver die 60 is disposed on second frame portion 82 and is positioned within second recess 48. At least partitioning divider 52 of housing 40 comprises liquid crystal polymer (LCP) such that infrared light internally-reflected within housing 40 between first and second recesses 50 and 48 and in the direction of partitioning divider 52 is substantially attenuated or absorbed by the LCP contained therein, more about which is said below.

In the embodiment of housing 40 shown in FIG. 1, housing thickness 58 most preferably ranges between about 0.3 mm and about 0.5 mm, housing width 54 most preferably ranges between about 2 mm and about 8 mm, and housing length 56 most preferably ranges between about 2 mm and about 8 mm.

Figure 2:
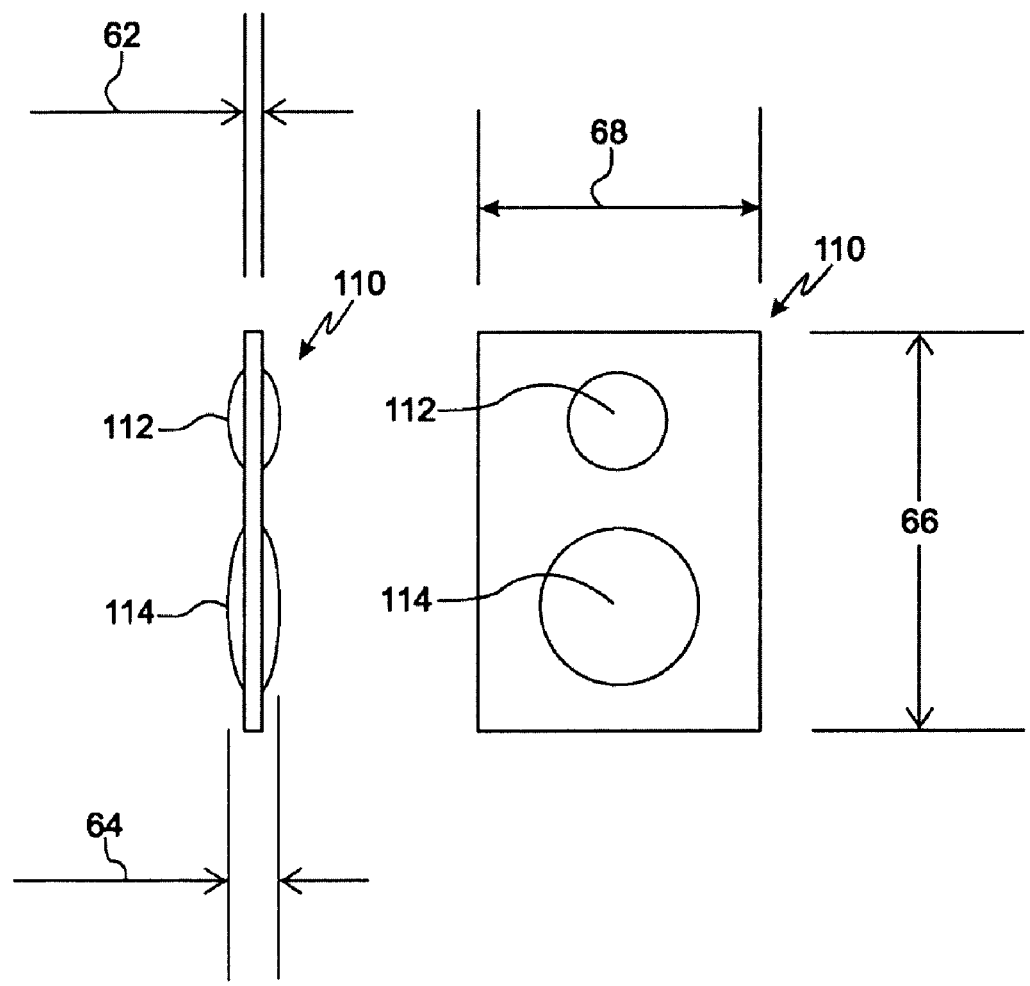
FIG. 2 shows one embodiment of the lens of FIG. 1.

FIGS. 1 and 2 also show lens assembly 110, which in a preferred embodiment comprises first and second lenses 112 and 114 configured to fit, respectively, over first recess 50 and second recess 48 such that infrared light transmitted upwardly by transmitter die 70 through first lens 112 is collimated and focused in an upward predetermined direction, and such that infrared light arriving at second lens 114 from a downward direction is collimated and focused towards receiver die 60. Although first lens 112 and second lens 114 are illustrated in FIG. 1 as being integrally molded or forming integral portions of lens assembly 110, other types of lens configurations are also contemplated, such as separate first and second lenses 112 and 114, concave lenses, convex lenses, compound lenses, fresnel lenses, and other types of lenses known to those skilled in the art capable of being configured to collimate and/or focus infrared light.

In a preferred embodiment, lens assembly 110 is formed of a suitable thermoset epoxy material, which may be poured atop transmitter die 70 into first recess 50 and atop receiver die 60 into second recess 48, and then cured at a suitable elevated temperature until sufficiently hardened. In one such embodiment, lens assembly 110 is formed of HYSOL™ CNB 897-21 or 22 thermoset epoxy manufactured by LOC-TITE™ Corporation. These two-part low-viscosity materials may be tinted black to permit infrared transmittance but little or no transmittance of light having wavelengths below about 750 nm or about 700 nm, and thus can be configured to act as low-cut filters. Thus, lens assembly 110 may be configured to act as a low-cut filter that at least partially rejects wavelengths of light less than about 700 nm or about 750 nm. Depending on the particular HYSOL composition employed, cure temperatures can range between about 85 degrees centigrade and about 100 degrees Centigrade, and cure times can range between about 90 minutes and about 5 and half hours.

FIG. 2 shows further details of lens assembly 110 of FIG. 1. In the embodiment of lens assembly 110 illustrated in FIGS. 1 and 2, lens assembly thickness 62 most preferably ranges between about 0.2 mm and about 0.5 mm, lens assembly width 68 most preferably ranges between about 3 mm and about 5 mm, and lens assembly length 66 most preferably ranges between about 3 mm and about 8 mm.

Figure 3:
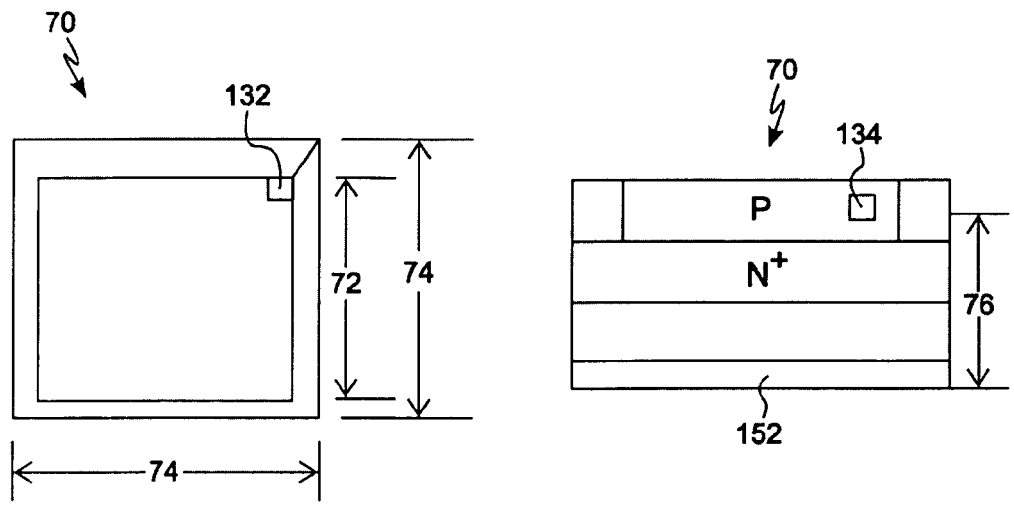
FIG. 3 shows top and side views of one embodiment of a receiver die suitable for use in some embodiments of the infrared proximity sensor package disclosed herein.

FIG. 3 shows top and side views of one embodiment of receiver die 70 suitable for use in some embodiments of infrared proximity sensor package 10 disclosed herein. In the embodiment illustrated in FIG. 3, receiver die 70 is a photo-diode chip manufactured by TYNTEK having model number TK-043 PD and comprises anode 132 having dimensions of 4 mm by 4 mm, cathode 152, thickness 76 of 12 mm, first width 72 of 34 mm, and second width 74 of 43 mm. Note that receiver 70 may be any one of a PIN diode, a photo-diode and a phototransistor.

Figure 4:
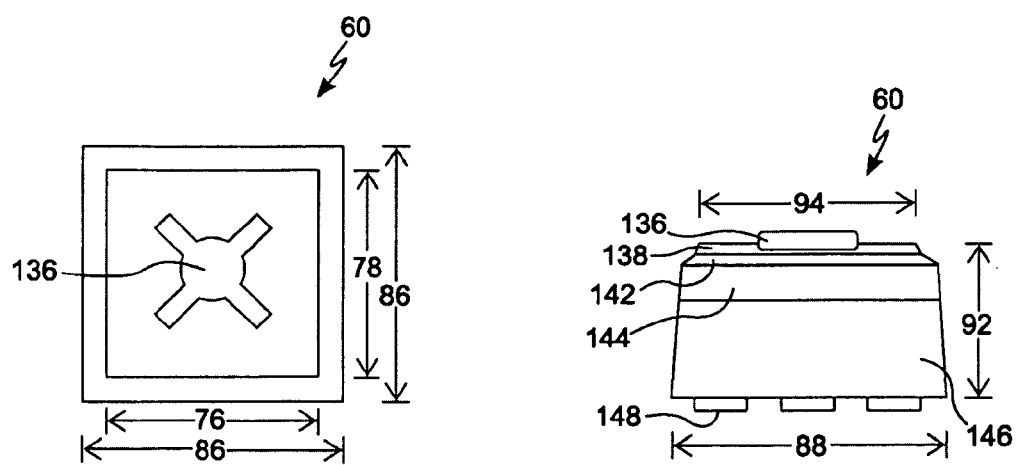
FIG. 4 shows top and side views of one embodiment of a transmitter die suitable for use in some embodiments of the infrared proximity sensor package disclosed herein.

FIG. 4 shows top and side views of one embodiment of transmitter die 60 suitable for use in some embodiments of infrared proximity sensor package 10 disclosed herein. In the embodiment illustrated in FIG. 4, transmitter die 60 is P/N mesa type AlGaAs/GaAs infrared chip, also manufactured by TYNTEK, having model number TK 114IRA and comprises P electrode 136, AlGaAs P epi layer 136*m* GaAs P epi layer 142, GaAs N epi layer 144, GaAs N substrate 146 and N electrode 148. Transmitter die dimensions 76 and 78 are, respectively, 305 mm and 355 mm. The thickness of transmitter die 60 illustrated in FIG. 4 is 12 mm.

In preferred embodiments, transmitter 70 and receiver 60 are configured for operation within a bandwidth ranging between about 800 nm and about 1100 mm, or between about 850 nm and about 900 nm. 11. When operably disposed within housing 40, an edge of transmitter die 70 closest to an edge of receiver die 60 is optimally less than about 2 mm so that package 10 may be made as small as practicable.

Figure 5:
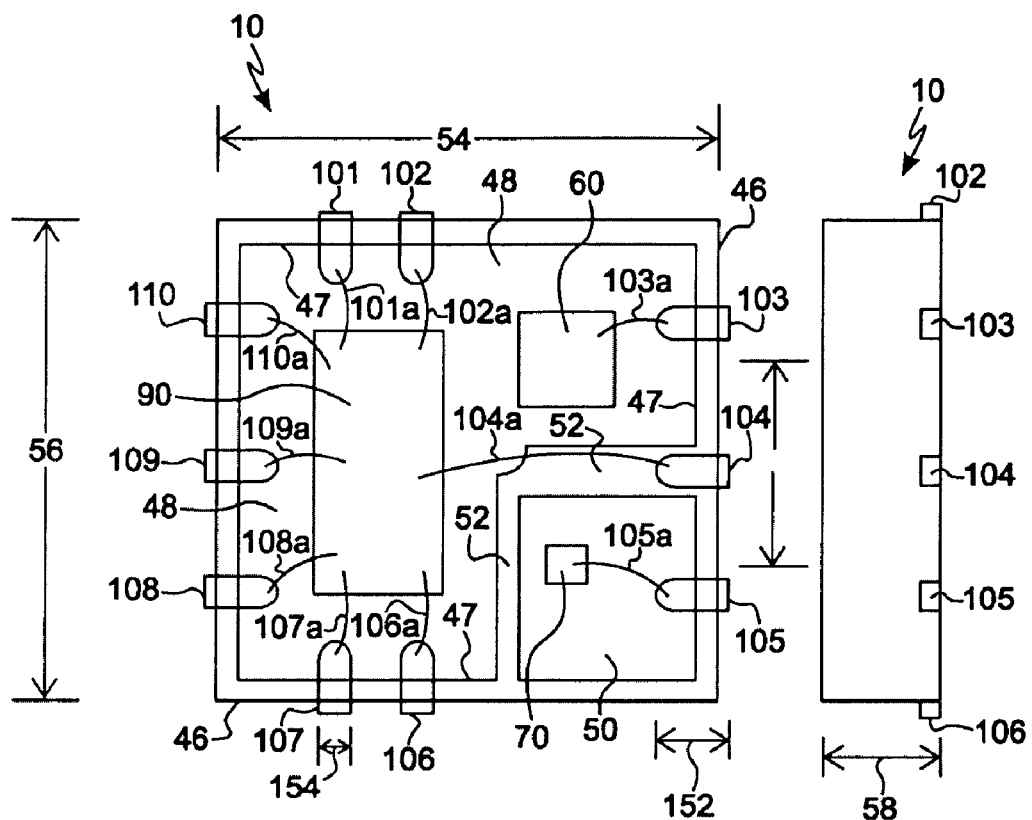
FIG. 5 shows top and side views of another embodiment of the infrared proximity sensor package disclosed herein.

FIG. 5 shows top and side views of another embodiment of infrared proximity sensor package 10 disclosed herein. Package 10 illustrated in FIG. 5 is particularly efficacious owing to its overall small size. For example, width 54 is only 4.5 mm, length 56 is only 4.5 mm, and thickness 58 is only 1.2 mm. Transmitter 70 is disposed within first recess or cavity 50, and is separated from second cavity 48 by partitioning divider 52. Receiver die 60 is disposed in second cavity 48 along with processor or ASIC 90, which in a preferred embodiment is operably connected to transmitter die 70 and receiver die 60 by means of wirebonding (not shown in FIG. 5). In preferred embodiments, terminal pins 101 through 110 are also operably connected to processor 90, transmitter die 70 and receiver die 60, as the case may be, by wirebond connections 101*a* though 110*a* shown in FIG. 5.

Other means of establishing electrical connections between external devices and the various components of package 10 may also be employed, such as solder ball and bump techniques, ball grid array techniques, or other techniques such as forming conventional solder connections.

Terminal pin width 154 is 0.3 mm, while terminal pin length 152 is 0.7 mm. Center-to-center distance 104 between transmitter die 70 and receiver die 60 is 2.15 mm. Outer sidewalls 46 and inner sidewalls 47 define the respective outer and inner perimeters of housing 40, along with portioning divider 52. The horizontal thickness of portioning divider 52 is about 0.8 mm on the upper side thereof, and about 0.3 mm on the left-hand side thereof. Not shown in FIG. 5 is a lead frame to which dice 60, 70 and 90 are attached, and which is secured to a bottom portion of housing 40. Other means may also be employed to operably associate such dice with housing 40, such as a printed circuit board or other type of substrate.

Terminal pins 101*a* through 110*a* are configured to permit electrical connection of package 10 to one or more electronic devices external thereto. Sensor package 10 may be incorporated into or operably connected to one or more of a portable electronic device, a hand-held portable electronic device, a stationary electronic device, a washing machine, a dryer, an exercise machine, an industrial control or switching device, a camera, a toy, a mobile telephone, a cellular telephone, a portable music player, a remote control, a television, an air conditioning unit, a heating unit, an audio playback device, an audio recording device, an MP3 player, a laptop computer, a personal data assistant (PDA), a radio, a transceiver, a telephone, an auto-volume adjustment circuit, and an open-phone detection circuit (such as may be employed in a clamshell-style mobile phone).

In still other embodiments of package 10, it is contemplated that dividing partition 52 has a thickness less than about 0.4 mm, package 10 has a width or a length less than about 5 mm, and/or a height less than at least one of about 3 mm, about 2 mm, and about 1.2 mm.

Referring now to FIGS. 1 and 5, housing 40 comprises upper housing portion 42, lower housing portion 44, outer sidewalls 46, inner sidewalls 47, first recess 50 and second recess 48. As previously described, first and second recesses 50 and 48 are separated by partitioning divider 52, which in a preferred embodiment is integrally molded to other portions of housing 40. In a preferred embodiment, the entire housing is injection molded from LCP. In other embodiments, at least dividing partition 52 comprises LCP, and one or more of outer sidewalls 46, upper housing portion 42, lower housing portion 44 comprises LCP. Less preferably, an admixture of LCP and a suitable polymer is employed to form housing 40 or various portions thereof. Also less preferably, dividing partition 52 may be formed of LCP, while the remaining portions of housing 40 are formed from plastic, a polymer, or a metal or metal alloy. In a preferred embodiment, at least portions of lead 80 frame are moldably integrated into housing 40.

As mentioned above, dividing partition 52 and preferably other portions of hosing 40 are formed of LCP such that infrared light internally-reflected within the housing in the direction of dividing partition 52 and/or other portions of housing 40 is substantially attenuated or absorbed by the LCP contained therein.

The unusual infrared radiation absorption and attenuation properties of LCP employed in the housing of the present invention are borne out by the comparative crosstalk measurements shown in Table 1 below. Table 1 shows the results of crosstalk measurements made using infrared transmitters and receivers placed in adjoining first and second cavities separated by sidewalls made of different materials. AVAGO TECHNOLOGIES™ HSDL-9100 proximity sensor packages were adapted to provide housings formed of different materials, and crosstalk was then measured.

TABLE 1

Crosstalk Measured in Infrared Proximity Sensor Packages Having Housings Formed of Different Materials

| Housing Type | Thickness of Partitioning Divider | Photocurrent Developed | Amount of Crosstalk Measured |
|---|---|---|---|
| Stainless Steel | 0.1 mm | 350 nA | 35 mV |
| Ceramic | 0.3 mm | 1.15 uA | 115 mV |
| Ceramic | 0.5 mm | 90 nA | 9 mv |
| Aluminum Foil | 0.2 mm | 150 nA | 15 mV |
| Liquid Crystal Polymer (LCP) | 0.3 mm | 120 nA | 12 mV |

Table 1 shows that an LCP housing provides crosstalk isolation performance similar to that of a housing formed from ceramic that is almost twice as thick. The housing of the invention may also be formed using well-known conventional injection molding processes, which from manufacturing and cost standpoints provides significant advantages respecting ceramic.

LCPs having suitable compositions and properties for use in infrared proximity sensor housings may be obtained from suppliers such as SOLVAY ADVANCED POLYMERS™ located at 4500 McGinnis Ferry Road, Alpharetta, Ga. 3005-3914. One type of LCP manufactured by Solvay Advanced Polymers that has been demonstrated to be particularly efficacious for forming housings of the present invention is XYDAR G-930, which is an LCP plastic material with filler and 30% glass fiber reinforcement. XYDAR G-930 LCP is a glass reinforced injection molding grade polymer developed specifically for electronic applications utilizing surface mount technology, and features excellent moldability characteristics. XYDAR G-930 resin can fill very thin walls over long flow lengths with little or no flash, even at mold temperatures below 200° F. (93° C.). In addition, it has low warpage in molded products and exceptional weld line strength. Like many other LCPs, XYDAR G-930 exhibits high strength and stiffness (even at elevated temperatures), a low coefficient of thermal expansion, a high deflection temperature, inherent flame resistance, and strong resistance to most chemicals, weathering, and radiation. In addition to SOLVAY ADVANCED POLYMENRS, other manufacturers of LCP include AMOCO PERFORMANCE PRODUCTS™ and HOECHST CELANESE CORPORATION™. Formulations of LCP suitable for use in forming the housings of the present invention include, but are not limited to, those which are biphenol-based and napthaline-based.

LCPs are relatively inert. They resist stress cracking in the presence of most chemicals at elevated temperatures, including aromatic or halogenated hydrocarbons, strong acids, bases, ketones, and other aggressive industrial substances. Hydrolytic stability in boiling water is also good. Easy processability of LCP resins may be attributed to their liquid-crystal molecular structure, which provides high melt flow and fast setup in molded parts. The physical properties of parts molded from LCP are generally not affected by minor variations in processing conditions, and thus little or no post-curing is required.

Figure 6:
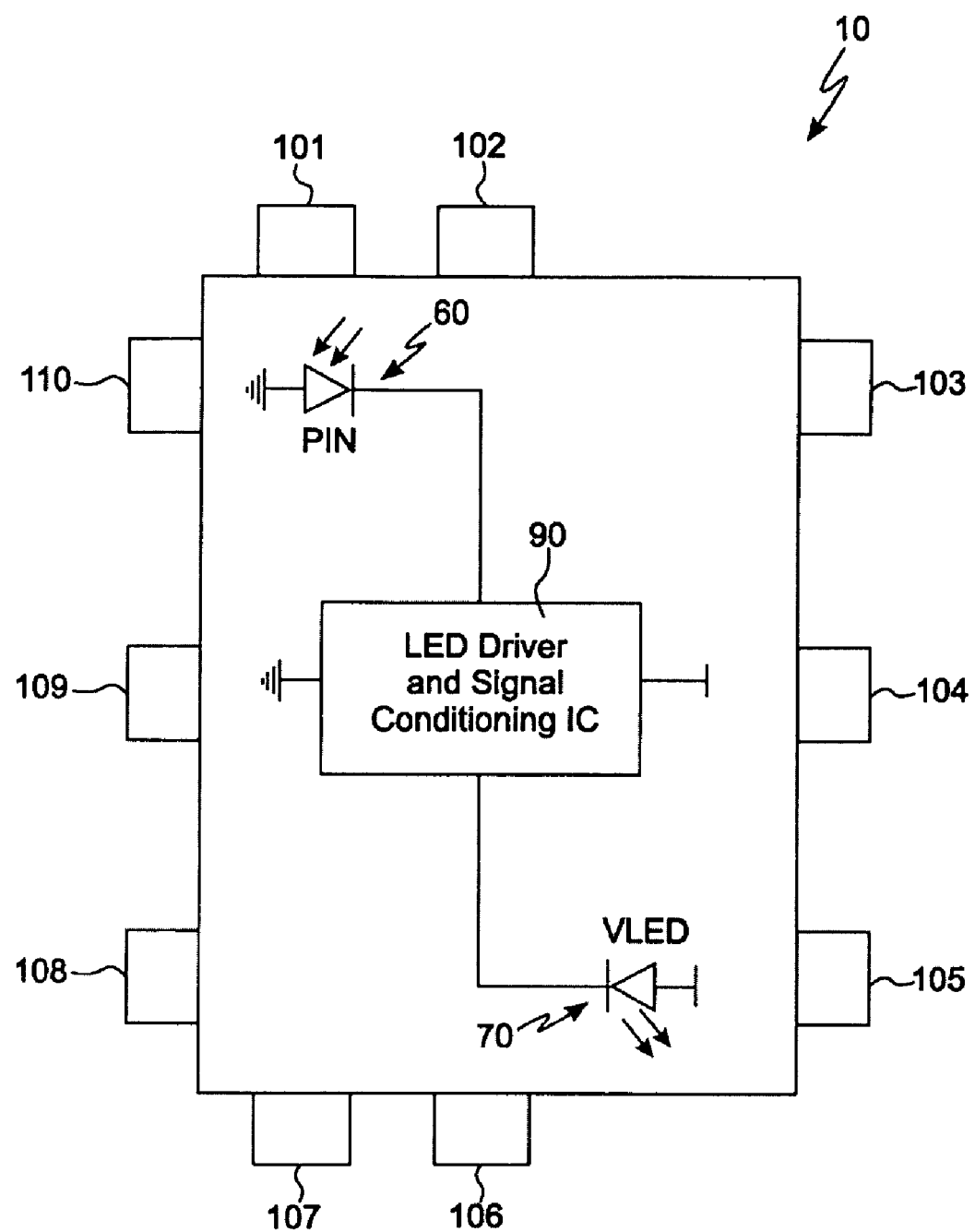
FIG. 6 shows a functional block diagram according to yet another embodiment of the infrared proximity sensor package disclosed herein.

FIG. 6 shows a functional block diagram according to yet another embodiment of infrared proximity sensor package 10 disclosed herein, where processor or ASIC 90 is operably connected to PIN receiver 60 and VLED receiver 70. Processor 90 preferably comprises transmitter driving circuitry, receiver detection circuitry and signal conditioning circuitry, and in preferred embodiments is an application specific integrated circuit (ASIC). Terminal pins 101 through 110 are operably connected to processor 90, transmitter 70 and receiver 60 by wirebonding or other suitable means known to those skilled in the art.

In one embodiment, there is provided a method of making infrared proximity sensor package 10 comprising providing infrared transmitter die 70, providing infrared receiver die 60, providing housing 40 comprising upper housing portion 42 and lower housing portion 44, outer sidewalls 46, first recess 50, second recess 48, first and second recesses 50 and 48 being separated by partitioning divider 52, at least partitioning divider 52 of housing 40 comprising LCP such that infrared light internally-reflected within housing 40 in the direction of partitioning divider 52 is substantially attenuated or absorbed by the LCP contained therein.

Such a method may further comprise any one or more of: (a) providing a lead frame configured to fit beneath the housing and engage the lower portions thereof, the lead frame comprising first and second frame portions; (b) attaching the lead frame to the lower housing portion; (c) disposing the transmitter die on the first frame portion and positioning the transmitter die within the first recess; (d) disposing the receiver die on the second frame portion and positioning the receiver die within the second recess; (e) molding the housing from LCP; and/or (f) integrably molding at least portions of the lead frame into the housing. Other methods of making or using package 10 or housing 40 are also contemplated, such as providing a housing frame or components made of a material other than LCP and coating or laminating same with LCP by injection molding or other means.

Figure 7:
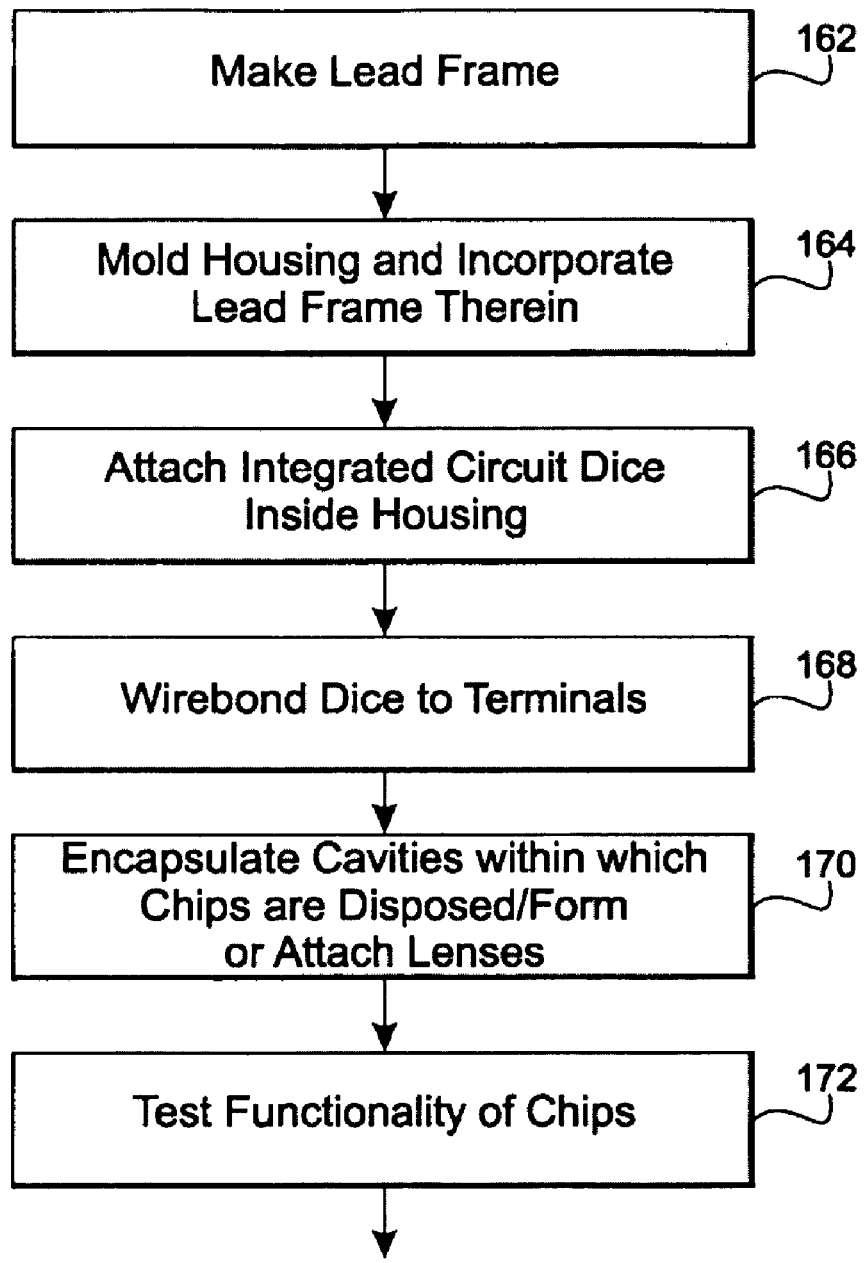
FIG. 7 shows various steps according to one method of making the infrared proximity sensor package disclosed herein.

FIG. 7 shows another method comprising making lead frame 80 (step 162), molding housing 40 and incorporating lead frame 80 therein (step 164), attaching integrated circuit dice 60 and 70 inside housing 40 (step 166), wirebonding dice 60 and 70 to terminals incorporated into or attached to housing 40 (step 168), encapsulating first and second cavities 50 and 48 with a flowable transparent material, preferably although not necessarily a thermoset epoxy, thereby to form a lens over dice 60 and 70 (step 170), and testing the functionality of chips 60 and 70 (step 172).

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

Note further that included within the scope of the present invention are methods of making and having made the various components, devices and systems described herein.

While the primary use of the input device of the present invention is believed likely to be in the context of relatively small portable devices, it may also be of value in the context of larger devices, including, for example, keyboards associated with desktop computers or other less portable devices such as, by way of non-limiting example only, exercise equipment, industrial control panels, or washing machines.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

We claim:

1. An infrared proximity sensor package, comprising:
an infrared transmitter die;
an infrared receiver die;
a housing comprising outer sidewalls, a first recess, a second recess and a partitioning divider disposed between the first and second recesses;
wherein the transmitter die is disposed in the first recess, the receiver die is disposed in the second recess, and at least the partitioning divider comprises liquid crystal polymer (LCP) such that infrared light internally-reflected within the housing in the direction of the partitioning divider is substantially attenuated or absorbed by the LCP contained therein.

2. The infrared proximity sensor package of claim 1, further comprising a lead frame configured to fit beneath the housing, have the transmitter die disposed on a first frame portion thereof and have the receiver die disposed on a second frame portion thereof such that the transmitter die is positioned within the first recess and the receiver die is positioned within the second recess.

3. The infrared proximity sensor package of claim 1, wherein the outer sidewalls comprise LCP such that infrared light internally-reflected within the housing in the direction of the outer sidewalls is substantially attenuated or absorbed by the LCP contained therein.

4. The infrared proximity sensor package of claim 1, wherein an upper housing portion comprises LCP such that infrared light internally-reflected within the housing in the direction of the upper housing portion is substantially attenuated or absorbed by the LCP contained therein.

5. The infrared proximity sensor package of claim 1, wherein a lower housing portion comprises LCP such that infrared light internally-reflected within the housing in the direction of the lower housing portion is substantially attenuated or absorbed by the LCP contained therein.

6. The infrared proximity sensor package of claim 1, wherein the housing is molded from LCP.

7. The infrared proximity sensor package of claim 1, wherein at least portions of the lead frame are moldably integrated into the housing.

8. The infrared proximity sensor package of claim 1, further comprising a processor die operably coupled to the transmitter die and the receiver die, the processor die comprising transmitter driving circuitry, receiver detection circuitry and signal conditioning circuitry.

9. The infrared proximity sensor package of claim 1, wherein the transmitter die comprises an infrared LED transmitter.

10. The infrared proximity sensor package of claim 1, wherein the receiver die comprises at least one of a PIN diode, a photo-diode and a phototransistor.

11. The infrared proximity sensor package of claim 1, wherein at least one of the transmitter die and the receiver die is configured for operation within a bandwidth ranging between about 800 nm and about 1100 nm, or between about 850 nm and about 900 nm.

12. The infrared proximity sensor package of claim 1, wherein an edge of the transmitter die closest to an edge of the receiver die is less than about 2 mm.

13. The infrared proximity sensor package of claim 1, further comprising a plurality of terminal pins configured to permit an electrical connection of the package to one or more electronic devices external thereto.

14. The infrared proximity sensor package of claim 1, wherein at least one of the transmitter die and receiver die are wirebonded to selected terminal pins integrated into the package.

15. The infrared proximity sensor package of claim 14, wherein the lens is configured to act as a low-cut filter that at least partially rejects wavelengths of light less than about 700 nm.

16. The infrared proximity sensor package of claim 14, wherein the lens is formed from a thermoset epoxy or a polymer.

17. The infrared proximity sensor package of claim 1, wherein the lead frame is a quad flat no lead (QFN) lead frame.

18. The infrared proximity sensor package of claim 1, wherein the sensor package is incorporated into an electronic device selected from the group consisting of a portable electronic device, a hand-held portable electronic device, a stationary electronic device, a washing machine, a dryer, an exercise machine, an industrial control or switching device, a camera, a toy, a mobile telephone, a cellular telephone, a portable music player, a remote control, a television, an air conditioning unit, a heating unit, an audio playback device, an audio recording device, an MP3 player, a laptop computer, a personal data assistant (PDA), a radio, and a transceiver.

19. The infrared proximity sensor package of claim 1, wherein the sensor package is incorporated into a telephone and operably connected to at least one of an auto-volume adjustment circuit and an open-phone detection circuit.

20. The infrared proximity sensor package of claim 1, further comprising a lens disposed over at least one of the transmitter die and the receiver die.

21. The infrared proximity sensor package of claim 1, wherein the partitioning divider has a thickness less than about 0.4 mm.

22. The infrared proximity sensor package of claim 1, wherein at least one of a length and a width of the package is less than about 5 mm.

23. The infrared proximity sensor package of claim 1, wherein a height of the package is less than at least one of about 3 mm, about 2 mm, and about 1.2 mm.

24. A method of making an infrared proximity sensor package, comprising:
- providing an infrared transmitter die;
- providing an infrared receiver die;
- providing a housing comprising outer sidewalls, a first recess, a second recess, and a partitioning divider disposed between the first recess and the second recess, at least the partitioning divider comprising liquid crystal polymer (LCP) such that infrared light internally-reflected within the housing in the direction of the partitioning divider is substantially attenuated or absorbed by the LCP contained therein;
- positioning the transmitter die within the first recess, and positioning the receiver die within the second recess.

25. The method of claim 24, further comprising providing a lead frame configured to fit beneath the housing and engage lower portions thereof.

26. The method of claim 25, further comprising providing the lead frame with first and second frame portions.

27. The method of claim 26, further comprising attaching the lead frame to a lower housing portion.

28. The method of claim 26, further comprising disposing the transmitter die on the first frame portion.

29. The method of claim 26, further comprising disposing the receiver die on the second frame portion.

30. The method of claim 24, further comprising molding the housing from a LCP.

31. The method of claim 24, further comprising integrably molding at least portions of the lead frame into the housing.

* * * * *